US012664345B1

(12) United States Patent　　(10) Patent No.:　US 12,664,345 B1
Bhushan et al.　　　　　　　　　(45) Date of Patent:　Jun. 23, 2026

(54) SYSTEM, METHOD, AND COMPUTER PROGRAM PRODUCT FOR AUTOMATIC PARTITIONING OF LARGE AND COMPLEX ANALOG/MIXED SIGNAL ELECTRONIC DESIGNS

(71) Applicant: Cadence Design Systems, Inc., San Jose, CA (US)

(72) Inventors: Sai Bhushan, Uttar Pradesh (IN); Satish Samuel Raj, Saratoga, CA (US); Supriya Ananthram, Los Gatos, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 699 days.

(21) Appl. No.: 18/174,826

(22) Filed: Feb. 27, 2023

(51) Int. Cl.
*G06F 30/30*　　　(2020.01)
*G06F 30/392*　　(2020.01)
*G06F 30/394*　　(2020.01)

(52) U.S. Cl.
CPC .......... *G06F 30/392* (2020.01); *G06F 30/394* (2020.01)

(58) Field of Classification Search
USPC ................ 716/110, 118, 124, 125, 126, 131
See application file for complete search history.

(56) References Cited

U.S. PATENT DOCUMENTS

| | | | | |
|---|---|---|---|---|
| 8,255,847 B1 * | 8/2012 | Brissenden | ............. | G06F 30/30 |
| | | | | 716/132 |
| 2002/0138816 A1 * | 9/2002 | Sarrafzadeh | .......... | G06F 30/392 |
| | | | | 716/123 |
| 2016/0179923 A1 * | 6/2016 | Chehreghani | ......... | G06F 16/355 |
| | | | | 707/637 |
| 2018/0189427 A1 * | 7/2018 | Brissenden | ........... | G06F 30/347 |

* cited by examiner

*Primary Examiner* — Brian Ngo
(74) *Attorney, Agent, or Firm* — Mark H. Whittenberger; Holland & Knight LLP

(57)　　　　　ABSTRACT

The present disclosure relates to a computer-implemented method for automatically partitioning an electronic design. Embodiments may include accessing, using the at least one processor, the electronic design and partitioning the electronic design using a multi-mode partitioning methodology. Embodiments may further include defining a cost function that determines a score for one or more partitioned sections of the electronic design from a plurality of partitioning methodologies and performing a routing operation on a first partitioned section and a second partitioned section from the one or more partitioned sections concurrently.

14 Claims, 4 Drawing Sheets

200 accessing, using the at least one processor, the electronic design

202 partitioning the electronic design using a multi-mode partitioning methodology

204 defining a cost function that determines an accuracy of one or more partitioned sections of the electronic design

206 performing a routing operation on a first partitioned section and a second partitioned section concurrently

208

200

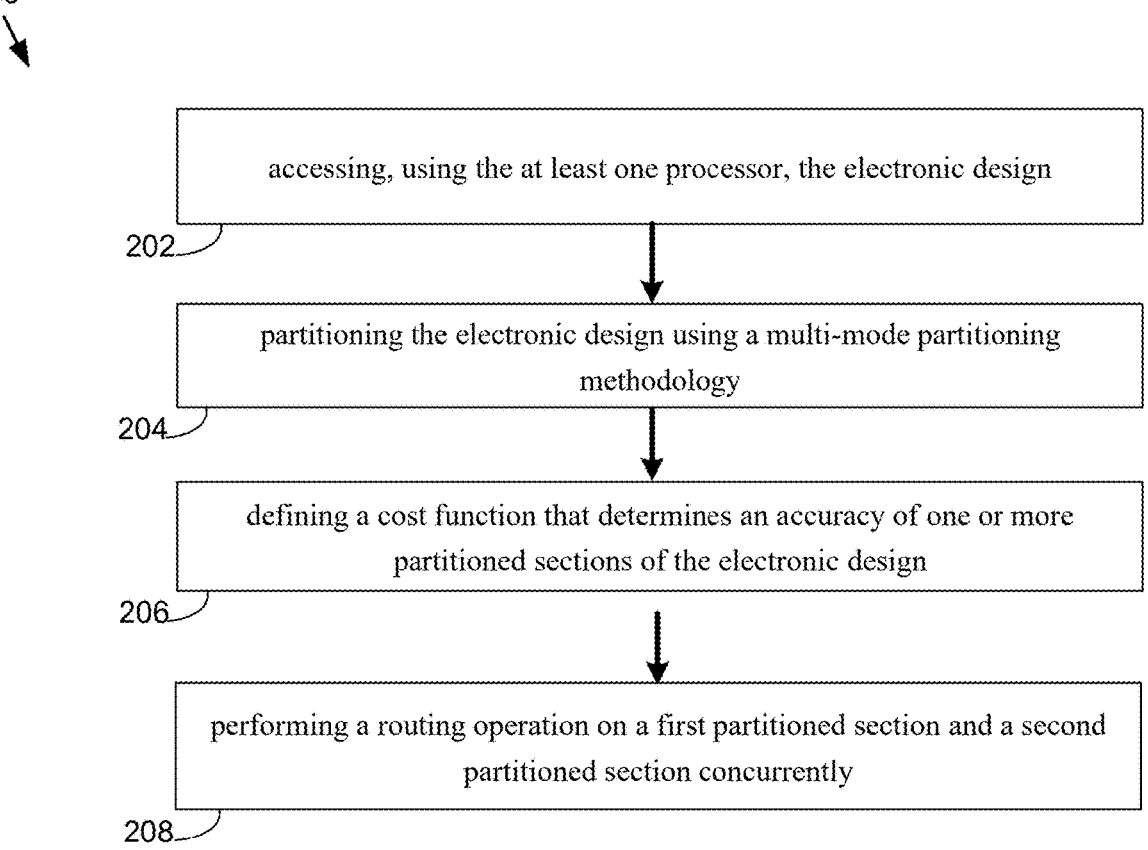

accessing, using the at least one processor, the electronic design

202 partitioning the electronic design using a multi-mode partitioning methodology

204 defining a cost function that determines an accuracy of one or more partitioned sections of the electronic design

206 performing a routing operation on a first partitioned section and a second partitioned section concurrently

\* Gaps are filled _only_ if there are any pin-figs that are not covered by any of the partitions.

SYSTEM, METHOD, AND COMPUTER PROGRAM PRODUCT FOR AUTOMATIC PARTITIONING OF LARGE AND COMPLEX ANALOG/MIXED SIGNAL ELECTRONIC DESIGNS

FIELD OF THE INVENTION

The present disclosure relates to electronic circuit design, and more specifically, to partitioning electronic designs.

DISCUSSION OF THE RELATED ART

In the field of electronics, routing a very large electronic design requires a great deal of memory and time. The user manually partitions the design and then has to route each partition separately. For such cases, users typically use divide and conquer approaches and then route smaller regions in isolation. Unfortunately, entering this data manually is a labor intensive task, which often results in errors in partitioning.

SUMMARY

In one or more embodiments of the present disclosure, a computer-implemented method for automatically partitioning an electronic design is provided. The method may include accessing, using the at least one processor, the electronic design and partitioning the electronic design using a multi-mode partitioning methodology. The method may further include defining a cost function that determines a score for one or more partitioned sections of the electronic design from a plurality of partitioning methodologies and performing a routing operation on a first partitioned section and a second partitioned section from the one or more partitioned sections concurrently.

One or more of the following features may be included. In some embodiments, the multi-mode partitioning methodology may include feature-based partitioning, cluster-based partitioning, and/or feature-based partitioning and cluster-based partitioning. The feature-based partitioning may include one or more of width spacing pattern based partitioning, row-region based partitioning, virtual groups based partitioning, modgen-based partitioning, and automatic grouping. The cost function may be based upon, at least in part, a number of spines associated with the electronic design. The method may further include identifying a most optimal partitioning approach based upon, at least in part, an output of the cost function.

In yet another embodiment of the present disclosure a non-transitory computer readable medium having stored thereon instructions that when executed by a processor result in one or more operations is included. Operations may include accessing, using the at least one processor, the electronic design and partitioning the electronic design using a multi-mode partitioning methodology. Operations may further include defining a cost function that determines a score for one or more partitioned sections of the electronic design from a plurality of partitioning methodologies and performing a routing operation on a first partitioned section and a second partitioned section from the one or more partitioned sections concurrently.

One or more of the following features may be included. In some embodiments, the multi-mode partitioning methodology may include feature-based partitioning, cluster-based partitioning, and/or feature-based partitioning and cluster-based partitioning. The feature-based partitioning may include one or more of width spacing pattern based partitioning, row-region based partitioning, virtual groups based partitioning, modgen-based partitioning, and automatic grouping. The cost function may be based upon, at least in part, a number of spines associated with the electronic design. Operations may further include identifying a most optimal partitioning approach based upon, at least in part, an output of the cost function.

In one or more embodiments of the present disclosure, a system for electronic design is provided. The system may include a computing device having at least one processor. The at least one processor may be configured to access, using the at least one processor, the electronic design. The at least one processor may be further configured to partition the electronic design using a multi-mode partitioning methodology. The at least one processor may be further configured to define a cost function that determines a score for one or more partitioned sections of the electronic design from a plurality of partitioning methodologies, the at least one processor further configured to perform a routing operation on a first partitioned section and a second partitioned section from the one or more partitioned sections concurrently.

One or more of the following features may be included. In some embodiments, the multi-mode partitioning methodology may include feature-based partitioning, cluster-based partitioning, and/or feature-based partitioning and cluster-based partitioning. The feature-based partitioning may include one or more of width spacing pattern based partitioning, row-region based partitioning, virtual groups based partitioning, modgen-based partitioning, and automatic grouping. The cost function may be based upon, at least in part, a number of spines associated with the electronic design.

Additional features and advantages of embodiments of the present disclosure will be set forth in the description which follows, and in part will be apparent from the description, or may be learned by practice of embodiments of the present disclosure. The objectives and other advantages of the embodiments of the present disclosure may be realized and attained by the structure particularly pointed out in the written description and claims hereof as well as the appended drawings.

It is to be understood that both the foregoing general description and the following detailed description are exemplary and explanatory and are intended to provide further explanation of embodiments of the invention as claimed.

BRIEF DESCRIPTION OF THE DRAWINGS

The accompanying drawings, which are included to provide a further understanding of embodiments of the present disclosure and are incorporated in and constitute a part of this specification, illustrate embodiments of the present disclosure and together with the description serve to explain the principles of embodiments of the present disclosure.

FIG. 2 is a flowchart depicting operations consistent with partitioning process in accordance with an embodiment of the present disclosure;

DETAILED DESCRIPTION

Figure 1:
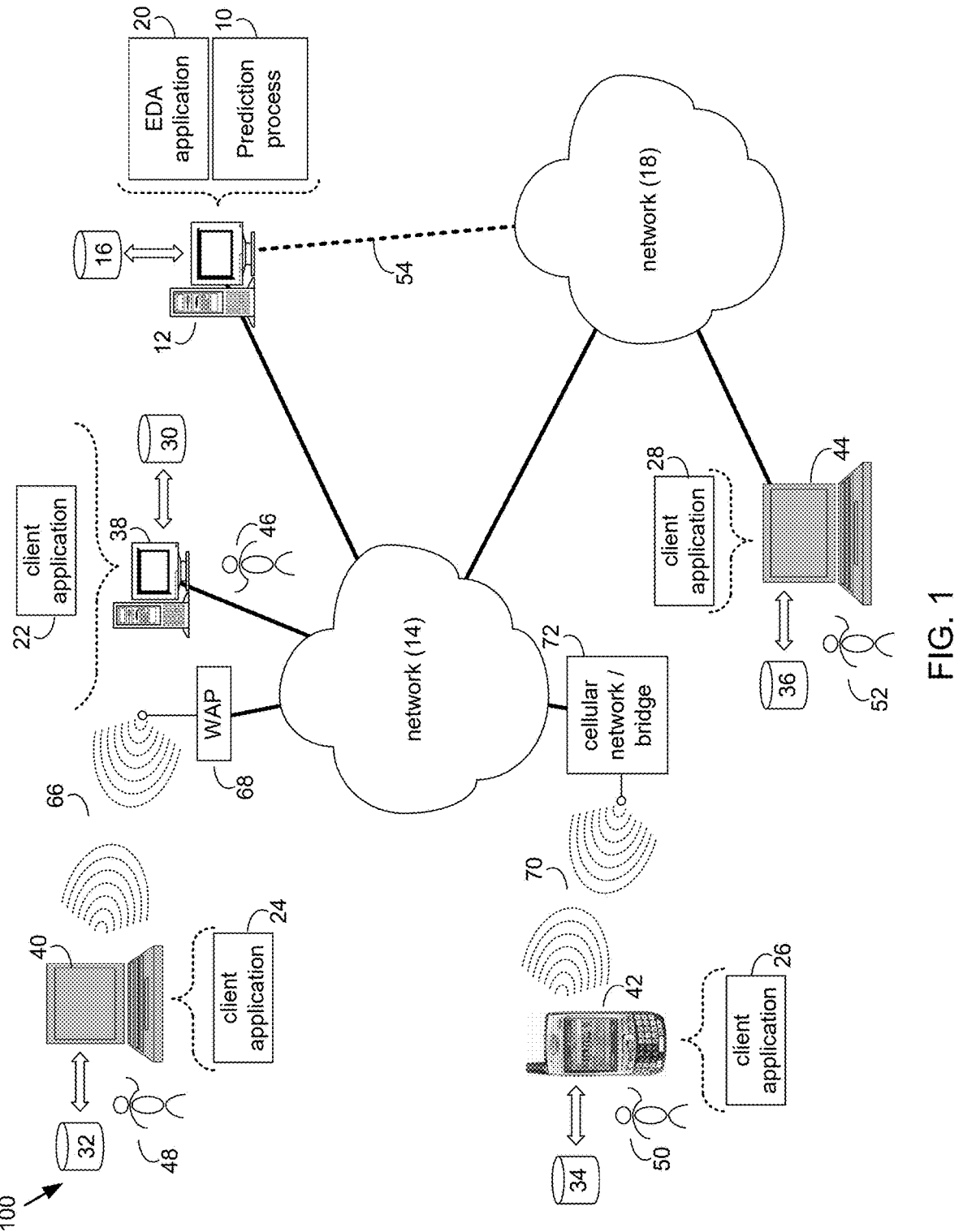
FIG. 1 is a diagram depicting an embodiment of a system in accordance with the present disclosure.

Reference will now be made in detail to the embodiments of the present disclosure, examples of which are illustrated in the accompanying drawings. The present disclosure may, however, be embodied in many different forms and should not be construed as being limited to the embodiments set forth herein. Rather, these embodiments are provided so that this disclosure will be thorough and complete, and will fully convey the concept of the disclosure to those skilled in the art.

As will be appreciated by one skilled in the art, the present disclosure may be embodied as a method, system, or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product on a computer-usable storage medium having computer-usable program code embodied in the medium.

As used in any embodiment described herein, "circuitry" may include, for example, singly or in any combination, hardwired circuitry, programmable circuitry, state machine circuitry, and/or firmware that stores instructions executed by programmable circuitry. It should be understood at the outset that any of the operations and/or operative components described in any embodiment herein may be implemented in software, firmware, hardwired circuitry and/or any combination thereof.

Any suitable computer usable or computer readable medium may be utilized. The computer readable medium may be a computer readable signal medium or a computer readable storage medium. A computer-usable, or computer-readable, storage medium (including a storage device associated with a computing device or client electronic device) may be, for example, but not limited to, an electronic, magnetic, optical, electromagnetic, infrared, or semiconductor system, apparatus, or device, or any suitable combination of the foregoing. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device. In the context of this document, a computer-usable, or computer-readable, storage medium may be any tangible medium that can contain, or store a program for use by or in connection with the instruction execution system, apparatus, or device.

A computer readable signal medium may include a propagated data signal with computer readable program coded embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations of the present invention may be written in an object oriented programming language such as Java, Smalltalk, C++ or the like. However, the computer program code for carrying out operations of the present invention may also be written in conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the flowchart and/or block diagram block or blocks.

One or more hardware description languages may be used in accordance with the present disclosures. Some hardware description languages may include, but are not limited to, Verilog, VHDL, and Verilog-AMS. Various other hardware description languages may also be used as well.

Referring to FIG. 1, there is shown partitioning process 10 that may reside on and may be executed by server computer 12, which may be connected to network 14 (e.g., the Internet or a local area network). Examples of server computer 12 may include, but are not limited to: a personal computer, a server computer, a series of server computers, a mini computer, and a mainframe computer. Server computer 12 may be a web server (or a series of servers) running a network operating system, examples of which may include but are not limited to: Microsoft® Windows® Server; Novell®

NetWare®; or Red Hat® Linux®, for example. (Microsoft and Windows are registered trademarks of Microsoft Corporation in the United States, other countries or both; Novell and NetWare are registered trademarks of Novell Corporation in the United States, other countries or both; Red Hat is a registered trademark of Red Hat Corporation in the United States, other countries or both; and Linux is a registered trademark of Linus Torvalds in the United States, other countries or both.) Additionally/alternatively, process 10 may reside on and be executed, in whole or in part, by a client electronic device, such as a personal computer, notebook computer, personal digital assistant, or the like.

The instruction sets and subroutines of partitioning process 10, which may include one or more software modules, and which may be stored on storage device 16 coupled to server computer 12, may be executed by one or more processors (not shown) and one or more memory modules (not shown) incorporated into server computer 12. Storage device 16 may include but is not limited to: a hard disk drive; a solid state drive, a tape drive; an optical drive; a RAID array; a random access memory (RAM); and a read-only memory (ROM). Storage device 16 may include various types of files and file types including but not limited, to hardware description language (HDL) files, which may contain the port type descriptions and executable specifications of hardware blocks.

Server computer 12 may execute a web server application, examples of which may include but are not limited to: Microsoft IIS, Novell Webserver™, or Apache® Webserver, that allows for HTTP (e.g., HyperText Transfer Protocol) access to server computer 12 via network 14 (Webserver is a trademark of Novell Corporation in the United States, other countries, or both; and Apache is a registered trademark of Apache Software Foundation in the United States, other countries, or both). Network 14 may be connected to one or more secondary networks (e.g., network 18), examples of which may include but are not limited to: a local area network; a wide area network; or an intranet, for example.

Server computer 12 may execute an electronic design automation (EDA) application (e.g., EDA application 20), examples of which may include, but are not limited to those available from the assignee of the present application. EDA application 20 may interact with one or more EDA client applications (e.g., EDA client applications 22, 24, 26, 28) for electronic design optimization.

Partitioning process 10 may be a stand alone application, or may be an applet/application/script that may interact with and/or be executed within EDA application 20. In addition/as an alternative to being a server-side process, the partitioning process may be a client-side process (not shown) that may reside on a client electronic device (described below) and may interact with an EDA client application (e.g., one or more of EDA client applications 22, 24, 26, 28). Further, the partitioning process may be a hybrid server-side/client-side process that may interact with EDA application 20 and an EDA client application (e.g., one or more of client applications 22, 24, 26, 28). As such, the processes may reside, in whole, or in part, on server computer 12 and/or one or more client electronic devices.

The instruction sets and subroutines of EDA application 20, which may be stored on storage device 16 coupled to server computer 12 may be executed by one or more processors (not shown) and one or more memory modules (not shown) incorporated into server computer 12.

The instruction sets and subroutines of EDA client applications 22, 24, 26, 28, which may be stored on storage devices 30, 32, 34, 36 (respectively) coupled to client electronic devices 38, 40, 42, 44 (respectively), may be executed by one or more processors (not shown) and one or more memory modules (not shown) incorporated into client electronic devices 38, 40, 42, 44 (respectively). Storage devices 30, 32, 34, 36 may include but are not limited to: hard disk drives; solid state drives, tape drives; optical drives; RAID arrays; random access memories (RAM); read-only memories (ROM), compact flash (CF) storage devices, secure digital (SD) storage devices, and a memory stick storage devices. Examples of client electronic devices 38, 40, 42, 44 may include, but are not limited to, personal computer 38, laptop computer 40, mobile computing device 42 (such as a smart phone, netbook, or the like), notebook computer 44, for example. Using client applications 22, 24, 26, 28, users 46, 48, 50, 52 may access EDA application 20 and may allow users to e.g., utilize partitioning process 10.

Users 46, 48, 50, 52 may access EDA application 20 directly through the device on which the client application (e.g., client applications 22, 24, 26, 28) is executed, namely client electronic devices 38, 40, 42, 44, for example. Users 46, 48, 50, 52 may access EDA application 20 directly through network 14 or through secondary network 18. Further, server computer 12 (e.g., the computer that executes EDA application 20) may be connected to network 14 through secondary network 18, as illustrated with phantom link line 54. Some or all of the operations discussed herein with regard to partitioning process 10 may be performed, in whole or in part, in the cloud as a cloud-based process including, for example, networks 14, 18 and any others.

The various client electronic devices may be directly or indirectly coupled to network 14 (or network 18). For example, personal computer 38 is shown directly coupled to network 14 via a hardwired network connection. Further, notebook computer 44 is shown directly coupled to network 18 via a hardwired network connection. Laptop computer 40 is shown wirelessly coupled to network 14 via wireless communication channel 66 established between laptop computer 40 and wireless access point (e.g., WAP) 68, which is shown directly coupled to network 14. WAP 68 may be, for example, an IEEE 802.11a, 802.11b, 802.11g, Wi-Fi, and/or Bluetooth device that is capable of establishing wireless communication channel 66 between laptop computer 40 and WAP 68. Mobile computing device 42 is shown wirelessly coupled to network 14 via wireless communication channel 70 established between mobile computing device 42 and cellular network/bridge 72, which is shown directly coupled to network 14.

As is known in the art, all of the IEEE 802.11x specifications may use Ethernet protocol and carrier sense multiple access with collision avoidance (e.g., CSMA/CA) for path sharing. The various 802.11x specifications may use phase-shift keying (e.g., PSK) modulation or complementary code keying (e.g., CCK) modulation, for example. As is known in the art, Bluetooth is a telecommunications industry specification that allows e.g., mobile phones, computers, and personal digital assistants to be interconnected using a short-range wireless connection.

Client electronic devices 38, 40, 42, 44 may each execute an operating system, examples of which may include but are not limited to Microsoft Windows, Microsoft Windows CE®, Red Hat Linux, or other suitable operating system. (Windows CE is a registered trademark of Microsoft Corporation in the United States, other countries, or both.)

Referring now to FIG. 2, an example flowchart depicting operations consistent with an embodiment of partitioning process 10 is provided. The process may include accessing (202), using the at least one processor, the electronic design and partitioning (204) the electronic design using a multi-mode partitioning methodology. The method may further include defining (206) a cost function that determines a score for one or more partitioned sections of the electronic design from a plurality of partitioning methodologies and performing (208) a routing operation on a first partitioned section and a second partitioned section from the one or more partitioned sections concurrently. Numerous other operations are also within the scope of the present disclosure.

Figure 3:
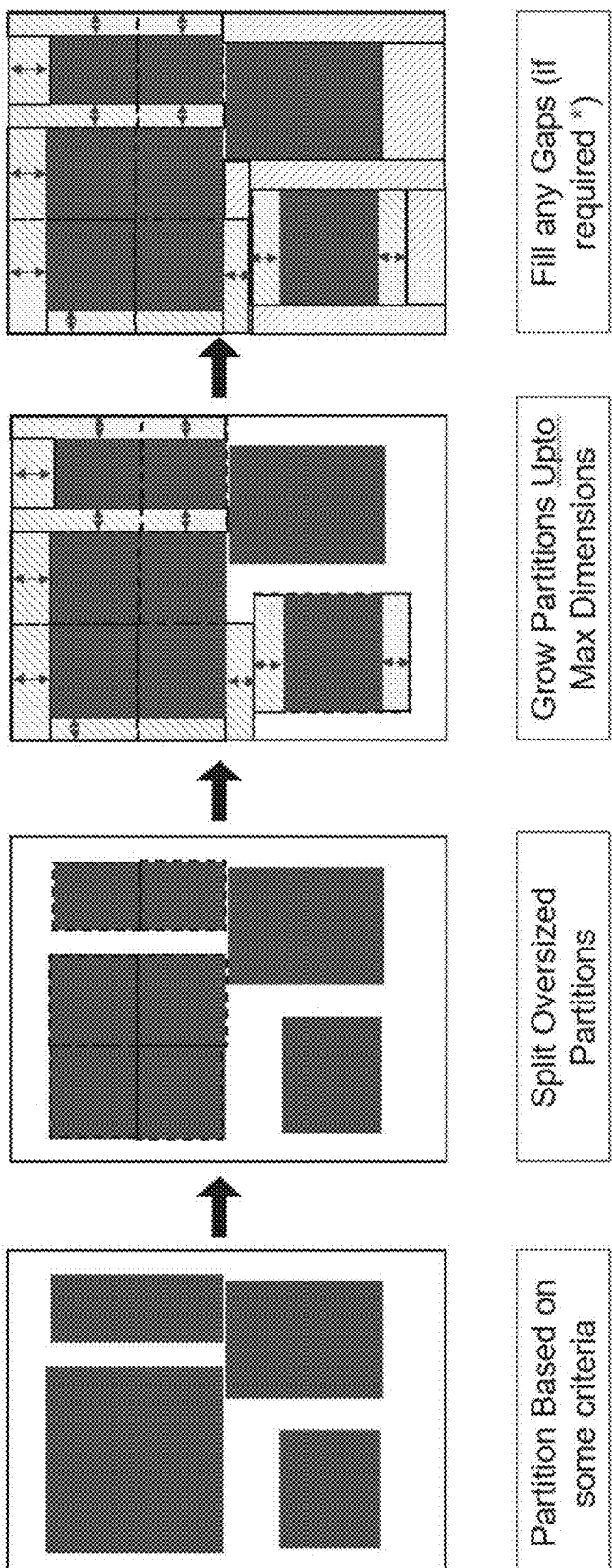
FIG. 3 is a graphical user interface depicting a partitioning process in accordance with an embodiment of the present disclosure.
Figure 4:
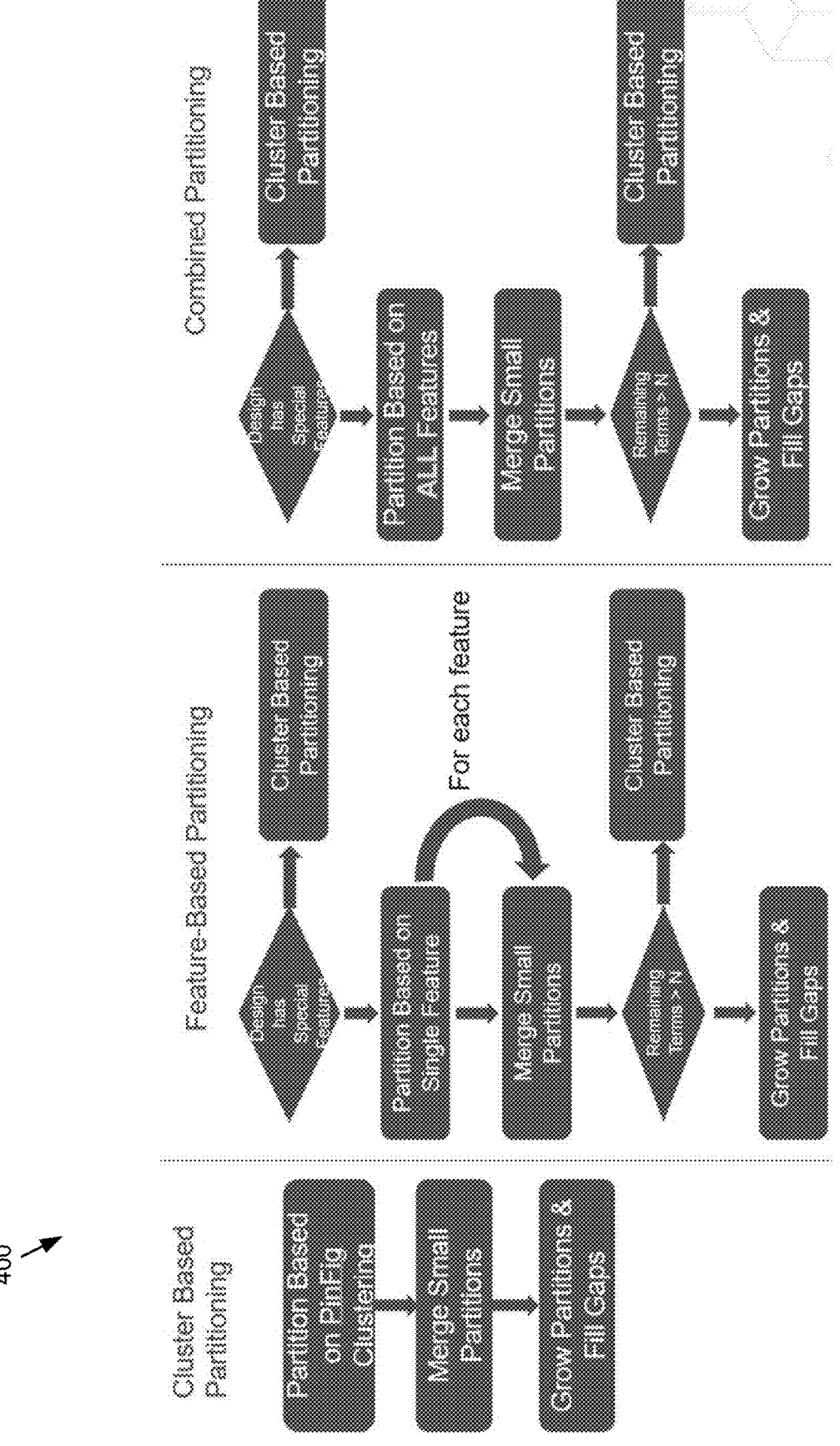
FIG. 4 is a flowchart depicting operations consistent with partitioning process in accordance with an embodiment of the present disclosure.

Referring now to FIGS. 3-4, embodiments consistent with partitioning process 10 are provided. Partitioning process 10 may be used to partition a large and complex design into reasonable and more manageable partitions that may be routed concurrently using one or more routing technologies such as those available from the assignee of the present disclosure. In existing systems, a user has to perform the partitioning manually which is not easy for a large/complex design. In contrast, embodiments of partitioning process 10 may apply a combination of feature-based partitioning and cluster-analysis to break the electronic design into smaller pieces. In some embodiments, a cost-function may be defined to compute the goodness of the partitions with regard to routing. Accordingly, embodiments of partitioning process 10 may use a combination of partitioning strategies to determine the best result. The cost function may provide a quantitative score for the different partitioning techniques based on their results, thereby helping to make an automatic choice for the best and most optimal partitioning result/style.

As discussed above, existing approaches are entirely manual and require extensive time and labor on the part of the user. Partitioning process 10 may utilize an automatic approach that may generate one or more partitions using a variety of different methods. For example, some may be purely feature-based, some may be based on cluster-analysis, and some may rely upon a combination of the two methods (e.g., feature-based, cluster-analysis, etc.). Embodiments of partitioning process 10 may define a cost-function to define the accuracy of the partitioned results. For each of the partitioning methods, the cost may be computed and the result with the best cost may be accepted. The partitioning techniques included herein are very fast and since number of partitions are usually minimal (e.g., less than 100), exploring multiple partition options/results does not result in a slower routing time. The cost of partitioning relies on a global router recommendation (such as those available from the Assignee of the present disclosure) and therefore the best result among the different partitioning outcomes is expected to give good routing result as well.

In some embodiments, partitioning process 10 may automatically analyze various parameters associated with an electronic design in order to identify a useful partition. The sizes of each partition should be approximately similar in size. As such, any variance (VA) in partition area should be minimal. The size of each partition should be close to a set maximum dimension. The number of partitions (NP) should be as small as possible. An example equation setting forth the minimum number of partitions is provided below:

Equation 1

$$NP = \text{Cell Area/Max Partition Area} = W \times H / \text{max\_W} \times \text{max\_H}$$

where W is the width of the design, H is the height of the design, max_W is the maximum permissible width for the partition and max_H is the maximum permissible height for the partition.

In some embodiments, the number of spines required to connect multiple partitions should be reduced. The term "spine", as used herein, may refer to a long interconnecting wire that crosses partition boundaries and forms a backbone for the connections associated with a net. These spines help in establishing a connection between pre-route shapes and pins across different partitions. The number of global-path segments (XGPS) crossing across a partition should also be reduced. The number of pins and pre-route shapes are nearly the same, however, this cannot be guaranteed as it may depend on the result of a placement operation. There should not be any overlaps between partitions. The partition sections/boundaries should not overlap with each other. To achieve maximum concurrency and efficiency, it is best if there is no overlap between the partition sections so that each router can route its region independent of others. This also reduces the likelihood of merge conflicts when the results are combined together from the different partition sections.

In some embodiments, partitioning process 10 may utilize one or more different electronic design partitioning approaches. One of these is feature-based partitioning. Examples of feature-based partitioning may include, but are not limited to, width spacing pattern (WSP) region based partitioning, row-region based partitioning, virtual groups based partitioning, module generator (modgen) based partitioning, and auto-groups (migration/reuse flow) each of which is discussed in further detail hereinbelow. It should be noted that any number of design features may be used and that those listed herein are provided merely by way of example.

In some embodiments, WSP-based partitioning may use the WSP (Width-Spacing Pattern) regions as the primary feature for partitioning. This method partitions the design based on WSP regions and then processes these partitions for merging or enlargement as required. Row-region based partitioning may use the row-regions as the primary feature for partitioning. Accordingly, row-regions are objects that may be used to place the devices in rows. For a large design, there may be multiple row-regions and this partitioning style attempts to treat each row-region as a partition of its own. If the row-regions are small in size, then they may be merged (within permissible maximum partition dimensions) to reduce the number of partitions. Modgen based partitioning may use modgens as the primary feature for partitioning. Modgens are a fig-group that represent a cohesive group of devices that need to be placed together and treated as a single unit. This partitioning style treats each modgen as a partition unless it is larger than the maximum permissible partition dimensions. Modgens usually have a smaller granularity compared to virtual groups. Virtual groups are usually composed of multiple modgens.

In some embodiments, virtual groups may be used to segregate devices into groups of uniform device types. The benefit of creating a virtual group is that it allows the designer to obtain an opaque or a transparent visualization of the design hierarchy. The EDA placer may treat the virtual group as a single entity and keeps all instances of the virtual group in close proximity. Auto-groups is a grouping of layout instances based on certain characteristics of the devices/instances that follow a certain template and therefore allow them to be part of the same group. The auto-group may be used to automatically identify instances that could/ should potentially form a group and therefore may need to be placed together. The reason for grouping may be connectivity of the devices, types of devices, the multiplicity of the devices etc.

In some embodiments, partitioning process 10 may also include cluster-based partitioning. These cluster-based partitioning approaches may be combined in a multi-mode partitioning approach with any or all of those described hereinabove.

In some embodiments, the determination of what partitioning method to use may be based upon, at least in part, a cost function. An example cost function is provided below:

$$Cost := Minimize(\alpha * VA + \beta * NP + \gamma * XGPS) \qquad \text{Equation 2}$$

In operation, partitioning process 10 may be configured to compute the cost of each partitioning method.

$$Cost := 0.2 * VA + 0.2 * NP + 0.6 * XGPS \qquad \text{Equation 3}$$

In this example, there are five heuristics, namely, WSP-region, row-region, virtual groups, auto-groups, modgens. The partitioning may be performed based on each of these heuristics individually. In addition to the partitioning involving these five heuristics, partitioning process 10 may include cluster-based partitioning and combined partitioning. Accordingly, there are 5+1+1=7 partitioning styles.

In this example, "NP"=number of partitions generated by a partitioning technique, "VA"=Variance in the partition areas, and "XGPS"=Number of global path-segments crossing the partition boundaries. For each of the 7 partitioning styles applied on a design, there may be different values for NP, VA and XGPS. Based upon these values, the cost may be computed for each partitioning style. The partitioning style with the minimum cost may be treated as the best (or most optimal) partitioning technique. If a partitioning technique generates 8 partitions, then NP would be 8, VA may be calculated as a regular statistical variance across the sizes of the 8 partitions and XGPS would be calculated based on the global router results, that is, the sum total of the global path-segments that cross partition boundaries. Partitioning process 10 may be configured to select the solution with the minimum cost.

Referring again to FIG. 3, an example embodiment showing a basic partitioning process depicting the partition, split, grow/enlarge, and fill operations is provided. In operation, partitioning process 10 may partition based upon some criteria, split the oversized partitions, enlarge the partitions up to some maximum dimensions, and then fill any gaps if necessary. In some embodiments, gaps may be filled only if there are any pin-figs that are not covered by any of the partitions.

For example, if a design is being partitioned based on modgens and if the design has five modgens, then it would initially create 5 partitions. If any of the modgens are bigger than the maximum permissible partition size, then the partition associated with that modgen may be split to comply with the maximum partition size restrictions. The other modgens may be smaller in size and therefore may be expanded into free regions (without causing any overlap) to reach up to the maximum permissible size or until the free space is exhausted. Even after the expansion of all the partitions, there may be some free space still available in the cell boundary which was not covered through expansion. If those free spaces contain any pins or pre-routes, then a partition may need to be created for those gaps as well so that it can be given to the router for routing the pins/pre-routes in those regions.

In some embodiments, using a combined partitioning approach, partitioning process 10 may use features in the design to identify initial bounding boxes for the partition. Some features in the design that may be used for partitioning guidance may include, but are not limited to, row-regions, local WSP regions, fin boundary grids, modgens, virtual/auto groups, schematic mapping (this may already have been taken care by row-regions and modgens), voltage domain (this may have already been taken care by placement tools). Row-regions are fig-groups representing a collection of rows where the devices can be placed. WSP-region are the width-spacing pattern definition to decide the width and spacing of routing tracks and their periodicity. A fin boundary grid may refer to a grid to place the FinFET devices. Modgens are fig-groups representing a cohesive group of devices.

In some embodiments, if the bounding boxes are of a "reasonable" size, then the process may generate a partition. If the bounding boxes are much smaller, then the process may attempt to merge it with any neighboring partition. If the smaller entities cannot be merged, then the process may treat them as figs and apply clustering to the remaining region. In some embodiments, the process may use a configurable parameter to decide what is to be treated as "small". By default, small may correspond to less than 10% of maximum permissible area. And by default "large" may be defined as greater than 110% of the maximum permissible area.

Embodiments of the partitioning process described herein provide numerous advantages over existing technologies. The teachings of the present disclosure are capable of leveraging intrinsic natural groupings in a design requiring algorithms that adapt to the design characteristics. Partitioning process 10 allows for the use of multiple design styles and constraints in the same design. Using a single style may not produce optimal partitioning. For example, a design with both row regions and modgens may be analyzed taking both into account separately and in combination to achieve the 'best' partitions. Embodiments of partitioning process 10 may be configured to handle small-sized groupings that are scattered and not suitable for merging. These small-sized objects are treated as 'fig' objects and partitioned using a cluster-partitioning algorithm to obtain better results.

Referring now to FIG. 4, an example embodiment showing a flowchart 400 depicting operations consistent with partitioning process 10 is provided. Flowchart 400 includes cluster-based partitioning operations, feature-based partitioning operations, and combined partitioning operations. Each of these is discussed in further detail hereinbelow.

In some embodiments, partitioning process 10 may utilize one or more grouping precedence rules. This may include a WSP Region (may contain one or more row-regions), a row region (may contain one or more virtual groups, modgens, rows), virtual groups (may contain one or more modgens), modgens (contains multiple rows), instance-rows, etc. For advanced nodes, that follow row-based placement, the individual rows may be the most basic unit. The grouping precedence may be used in the combined partitioning methodology to decide the order in which the features need to be examined. The order is in decreasing order of granularity where bigger-sized features are given a higher priority than smaller-sized features.

As discussed above, in some embodiments, partitioning process 10 may utilize a cluster-based partitioning process. Here, the maximum area for a routing region is defined as "MA" and the total design area is defined as "TDA". The intent here is to perform cluster analysis on pin-figs to identify clusters of relevance. Embodiments included herein may utilize K-Means clustering, however one of biggest challenge in using this approach is to identify and/or provide the number of clusters as input. Performing cluster-analysis on pin-figs (using K-Means) with a different number of clusters may be extremely time intensive. Therefore, as an initial operation, cluster analysis may be performed on instances (instead of pin-figs) which may be much faster and may be performed across different number of clusters. The range used for a number of clusters may range from TDA/(MA*0.75) to TDA/(MA*1.25). In some embodiments, the number of clusters that results in minimum inertia (worst-case-center-distance) may be taken as the final number of clusters.

In some embodiments, the number of clusters identified above may be passed as an input to the K-Means algorithm for performing cluster analysis on pin-figs. The cluster analysis may provide the location of one or more centroids. Pin-figs belonging to each cluster may be sorted by its distance from its respective centroid. The centroids may be taken as the origin and all the clusters may be expanded simultaneously by merging the sorted pin-figs one at a time (until an overlap is detected). The merged bounding-boxes for all of the clusters may result in the final "non-overlapping" partitions created using this method.

As discussed above, in some embodiments, partitioning process 10 may utilize a feature-based partitioning process. Here, the maximum area for a routing region is defined again as "MA". Partitioning process 10 may then collect one or more objects for the specific feature/category (e.g., modgen, row-region, etc.). Partitioning process may then create one or more partitions for each object and then check overlaps and combine overlapping partitions. Partitioning process may split one or more over-sized partitions and then merge smaller partitions that may be combined up to the max-area limit (MA). Partitioning process 10 may then enlarge the partitions and fill in the gaps.

In some embodiments, partitioning process 10 may employ a combined partitioning approach. Here, the maximum area for a routing region is defined again as "MA" and the total number of pins is defined as "N". Partitioning process 10 may then collect one or more objects from all categories based on a the grouping precedence. Accordingly, partitioning process 10 may ignore any object that is >1.1*MA (e.g., too-large objects), ignore any object that is <0.1*MA (e.g., too-small objects), and for all other objects create a partition object. Partitioning process 10 may then check for overlaps and then combine any overlapping partitions. The process may merge smaller partitions that may be combined up to the maximum area limit (MA). If the number of pins not in any partition>0.5*N, partitioning process 10 may then apply clustering. If not, the process may enlarge the partitions and fill the gaps It will be apparent to those skilled in the art that various modifications and variations can be made in the embodiments of the present disclosure without departing from the spirit or scope of the present disclosure. Thus, it is intended that embodiments of the present disclosure cover the modifications and variations provided they come within the scope of the appended claims and their equivalents.

What is claimed is:

1. A computer-implemented method for automatically partitioning an electronic design comprising:
   accessing, using at least one processor, the electronic design;
   partitioning the electronic design using a multi-mode partitioning methodology, wherein the multi-mode partitioning methodology includes feature-based partitioning and cluster-based partitioning, and wherein the feature-based partitioning includes two or more of width spacing pattern based partitioning, row-region based partitioning, virtual groups based partitioning, modgen-based partitioning, and automatic grouping;
   defining a cost function that determines a score for one or more partitioned sections of the electronic design from a plurality of partitioning methodologies; and
   performing a routing operation on a first partitioned section and a second partitioned section from the one or more partitioned sections concurrently.

2. The computer-implemented method for electronic design of claim 1, wherein the multi-mode partitioning methodology includes feature-based partitioning.

3. The computer-implemented method for electronic design of claim 1, wherein the multi-mode partitioning methodology includes cluster-based partitioning.

4. The computer-implemented method for electronic design of claim 1, wherein the cost function is based upon, at least in part, a number of spines associated with the electronic design.

5. The computer-implemented method for electronic design of claim 4, further comprising:
   identifying a most optimal partitioning approach based upon, at least in part, an output of the cost function.

6. A non-transitory computer-readable storage medium having stored thereon instructions, which when executed by a processor result in one of more operations for electronic design, the operations comprising:
   accessing, using the at least one processor, the electronic design;
   partitioning the electronic design using a multi-mode partitioning methodology, wherein the multi-mode partitioning methodology includes feature-based partitioning and cluster-based partitioning, and wherein the feature-based partitioning includes two or more of width spacing pattern based partitioning, row-region based partitioning, virtual groups based partitioning, modgen-based partitioning, and automatic grouping;
   defining a cost function that determines a score for one or more partitioned sections of the electronic design from a plurality of partitioning methodologies; and
   performing a routing operation on a first partitioned section and a second partitioned section from the one or more partitioned sections concurrently.

7. The non-transitory computer-readable storage medium of claim 6, wherein the multi-mode partitioning methodology includes feature-based partitioning.

8. The non-transitory computer-readable storage medium of claim 6, wherein the multi-mode partitioning methodology includes cluster-based partitioning.

9. The non-transitory computer-readable storage medium of claim 6, wherein the cost function is based upon, at least in part, a number of spines associated with the electronic design.

10. The non-transitory computer-readable storage medium of claim 9, further comprising:
   identifying a most optimal partitioning approach based upon, at least in part, an output of the cost function.

11. An electronic design system comprising:

at least one processor configured to access, using the at least one processor, the electronic design, the at least one processor further configured to partition the electronic design using a multi-mode partitioning methodology, wherein the multi-mode partitioning methodology includes feature-based partitioning and cluster-based partitioning, and wherein the feature-based partitioning includes two or more of width spacing pattern based partitioning, row-region based partitioning, virtual groups based partitioning, modgen-based partitioning, and automatic grouping, the at least one processor further configured to define a cost function that determines a score for one or more partitioned sections of the electronic design from a plurality of partitioning methodologies, the at least one processor further configured to perform a routing operation on a first partitioned section and a second partitioned section from the one or more partitioned sections concurrently.

12. The electronic design system of claim 11, wherein the multi-mode partitioning methodology includes feature-based partitioning.

13. The electronic design system of claim 11, wherein the multi-mode partitioning methodology includes cluster-based partitioning.

14. The electronic design system of claim 11, wherein the cost function is based upon, at least in part, a number of spines associated with the electronic design.

\*  \*  \*  \*  \*